United States Patent
Bernstein et al.

(10) Patent No.: US 6,794,901 B2
(45) Date of Patent: Sep. 21, 2004

(54) APPARATUS FOR REDUCING SOFT ERRORS IN DYNAMIC CIRCUITS

(75) Inventors: Kerry Bernstein, Underhill, VT (US); Philip G. Emma, Danbury, CT (US); John A. Fifield, Underhill, VT (US); Paul D. Kartschoke, Williston, VT (US); Norman J. Rohrer, Underhill, VT (US); Peter A. Sandon, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/064,921

(22) Filed: Aug. 29, 2002

(65) Prior Publication Data

US 2004/0041590 A1 Mar. 4, 2004

(51) Int. Cl.[7] .......................................... H03K 19/096
(52) U.S. Cl. .......................................... 326/95; 326/98
(58) Field of Search ................. 326/93–98, 16

(56) References Cited

U.S. PATENT DOCUMENTS

| | | | |
|---|---|---|---|
| 4,638,463 A | 1/1987 | Rockett, Jr. ................. 365/205 |
| 5,303,190 A | 4/1994 | Pelley, III ............... 365/189.11 |
| 5,764,656 A | 6/1998 | Pelella et al. ............ 371/22.31 |
| 5,982,691 A | 11/1999 | Shabde et al. ............... 365/206 |
| 5,999,465 A | 12/1999 | Shabde et al. ............... 365/200 |
| 6,002,292 A | * 12/1999 | Allen et al. .................. 327/379 |
| 6,087,849 A | 7/2000 | Zhang .......................... 326/34 |
| 6,127,864 A | 10/2000 | Mavis et al. ................. 327/144 |
| 6,211,692 B1 | 4/2001 | Shabde et al. ............... 324/765 |
| 6,271,568 B1 | 8/2001 | Woodruff et al. ........... 257/379 |
| 6,292,029 B1 | 9/2001 | Kumar et al. .................. 326/98 |
| 6,346,831 B1 | * 2/2002 | Krishnamurthy et al. ..... 326/98 |

* cited by examiner

*Primary Examiner*—Anh Q. Tran
(74) *Attorney, Agent, or Firm*—Schmeiser, Olsen & Watts; Richard A. Henkler

(57) ABSTRACT

An integrated circuit that includes a dynamic logic gate having an output node at which a logical output value of the logic gate is detected and also includes a circuit for selectable alteration of the soft error susceptibility of the dynamic logic gate.

8 Claims, 4 Drawing Sheets

APPARATUS FOR REDUCING SOFT ERRORS IN DYNAMIC CIRCUITS

BACKGROUND OF THE INVENTION

The present invention relates to the field of integrated circuits; more specifically, it relates to reducing soft errors in integrated circuits that include dynamic circuits. BACKGROUND OF THE INVENTION Dynamic circuits, such as domino circuits, for example, are widely used in high-speed integrated circuit designs. This is because dynamic circuits typically provide area and speed advantages over corresponding static complementary metal oxide semiconductor (CMOS) circuits.

Dynamic circuits, however, are more vulnerable to soft errors as compared to their static counterparts. A soft error is a transient, single event upset that changes the state of a circuit node or other internal storage element. Soft errors, for example, may be caused by alpha particles or cosmic rays impinging on the integrated circuit device.

Alpha particles are charged particles that may originate from the decay of trace impurities in integrated circuit packaging materials, for example. Cosmic rays may include heavy ions and protons that, either directly or indirectly, may have an ionization effect within the integrated circuit device semiconductor material. In either case, the charged particles from these sources may change the charge at an integrated circuit node such that the node actually transitions to an opposite logical state.

The critical charge (Qcrit) at a node is an indication of the susceptibility of the node to such soft errors. Qcrit is the minimum charge beyond which operation of a circuit will be affected. Thus, if an ion strike causes charge collected at a node to exceed Qcrit, the node may erroneously transition from a logical one state to a logical zero state, or from a logical 0 to a logical 1 state.

Since the maximum frequency at which an integrated circuit can be clocked depends on the Qcrit of the circuit, the immunity of the circuit must be traded off against the clock frequency. Clock frequency is adversely effected by higher Qcrit levels in dynamic circuits. The same integrated circuit may be used in multiple applications. High performance applications require high clock frequencies and thus a lower Qcrit. High reliability applications require high Qcrit, but must run at lower clock frequencies. A given device may be used in either application. A single device may be used in a high reliability mode at one moment and in a high performance mode another moment.

Therefore, the tradeoff between reliability against soft errors expressed as a Qcrit level and performance of a dynamic circuits presents designers of dynamic circuits significant problems.

BRIEF SUMMARY OF THE INVENTION

A first aspect of the present invention is an integrated circuit comprising: a dynamic logic gate having an output node at which a logical output value of the logic gate is detected; and selectable circuit means for alteration of the soft error susceptibility of the dynamic logic gate.

A second aspect of the present invention is an integrated circuit comprising: a dynamic logic gate having an output node at which a logical output value of the logic gate is detected; and a keeper circuit adapted to selectively alter the critical charge of the dynamic logic gate.

A third aspect of the present invention is an integrated circuit comprising: a dynamic logic gate having an output node at which a logical output value of the logic gate is detected; a keeper circuit providing a level of critical charge to the output node; and a body bias circuit, the body bias circuit adapted to selectively alter the bias voltage applied to the bodies of input devices of the dynamic logic gate.

BRIEF DESCRIPTION OF THE SEVERAL VIEWS OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Critical charge is defined as the minimum amount of charge injected into a given circuit node which is sufficient to corrupt the logic state of the circuit. Corruption of the logic state of the circuit is defined as changing the state of the internal node and/or the output of the circuit from a logical 0 before the radiation event to a logical 1 after the radiation event or from a logical 1 before the radiation event to a logical 0 after the radiation event. The injection of this charge into a circuit node is presumed in this definition to be caused by a radiation-induced ionization incident occurring on the given node.

Figure 1:
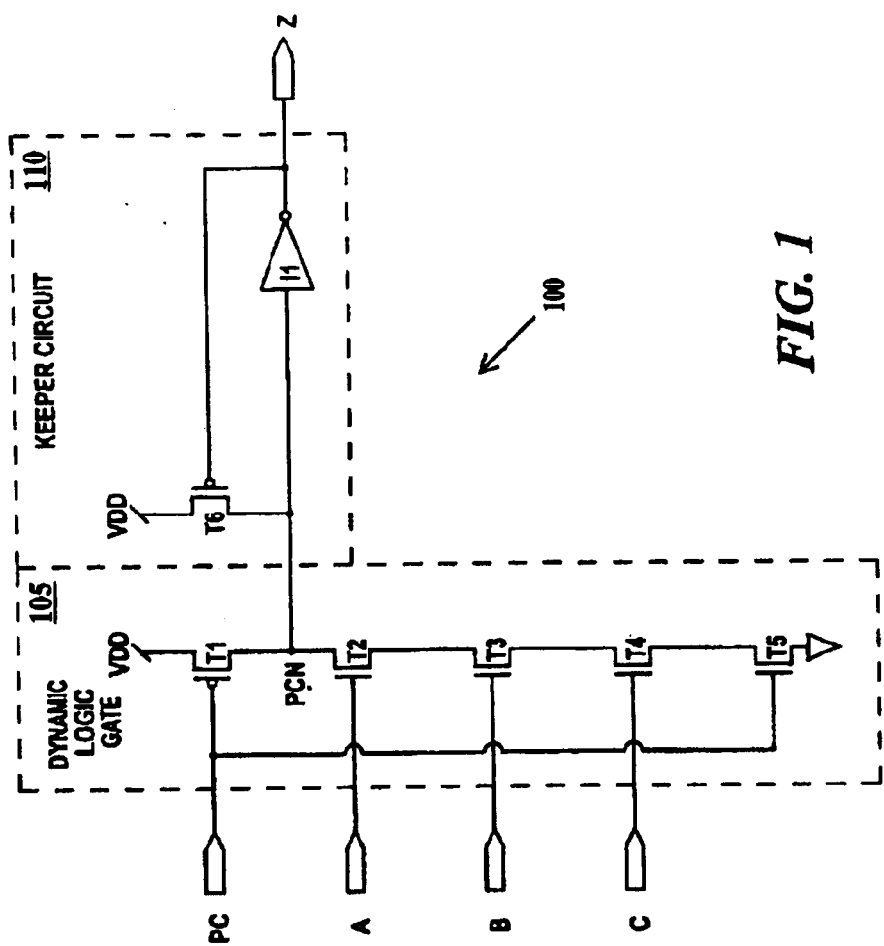
FIG. 1 is a schematic diagram of a dynamic circuit.

FIG. 1 is a schematic diagram of a dynamic circuit. In FIG. 1, dynamic circuit 100 includes a dynamic logic gate 105 having inputs PC, A, B, and C and a precharge/output node PCN and a keeper circuit 110 having an output Z. An input of keeper circuit 110 is coupled to precharge/output node PCN of dynamic logic gate 105.

Dynamic logic gate 105 is a three input domino NAND gate and is used as an exemplary dynamic logic gate. Other types of domino gates or other combinational logic gates may be substituted. Dynamic logic gate 105 includes a precharge device (PFET T1), and NFETs T2, T3, T4 and T5. NFET T5 is a foot switch. The source of PFET T1 is coupled to VDD, the gate of PFET T1 is coupled to input PC and the drain of PFET T1 is coupled to the drain of NFET T2. The gate of NFET T2 is coupled to input A and the source of NFET T2 is coupled to the drain of NFET T3. The gate of NFET T3 is coupled to input B and the source of NFET T3 is coupled to the drain of NFET T4. The gate of NFET T4 is coupled to input C and the source of NFET T4 is coupled to the drain of NFET T5. The source of NFET T5 is coupled to ground and the gate of NFET T5 is coupled to input PC. Input PC receives a precharge signal that charges precharge/output node PCN prior to data signals being applied to inputs A, B and C. During a precharge phase precharge/output node PCN may be charged to a predetermined level (a logical 1 in the present example) and during an evaluate phase, an output value based on data signals applied to input nodes A, B and C may be read out at output Z.

Keeper circuit 110 includes a keeper device (PFET T6) and an inverter I1. The drain of PFET T6 and the input of inverter I1 are coupled to precharge/output node PCN. The output of inverter I1 is coupled to output Z. The gate of PFET T6 is coupled between the output of inverter I1 and output Z. The source of PFET T6 is coupled to VDD. Inverter I1 acts as a feedback device for PFET T6. Because the charge on precharge/output node PCN is not held by any device (it is dynamic), keeper circuit 110 keeps precharge/output node PCN charged through PFET T6. A logical 1 (the precharge state) on precharge/output node PCN turns on PFET T6 so precharge/output node PCN is coupled to VDD. During evaluate mode whenever a logical 1 is on precharge/output node PCN, PFET T6 is off.

Charge can be lost to precharge/output node PCN through various leakage paths, by capacitive coupling of precharge/output node PCN, by spilling charge through junction diodes and by a radiation event affecting devices coupled to precharge/output node PCN. By design, PFET T6 can only supply a trickle of positive charge to precharge/output node PCN, otherwise PFET T6 could override the output signal generated by the data signals at inputs A, B and C or add a hysteric delay. The problem with a discharge of precharge/output node PCN caused by a large radiation event during precharge mode is that PFET T6 cannot charge precharge/output node PCN back quickly and the circuit(s) coupled to output Z interprets the discharge as a true data signal; thus a soft error is generated. For example, with a logical 0 on input A and logical 1 on inputs B and C, a negative radiation event in bulk silicon substrates or a positive radiation event in silicon-on-insulator (SOI) substrates event to the gate (or other devices) device coupled to input A will cause precharge/output node PCN to discharge.

Figure 2:
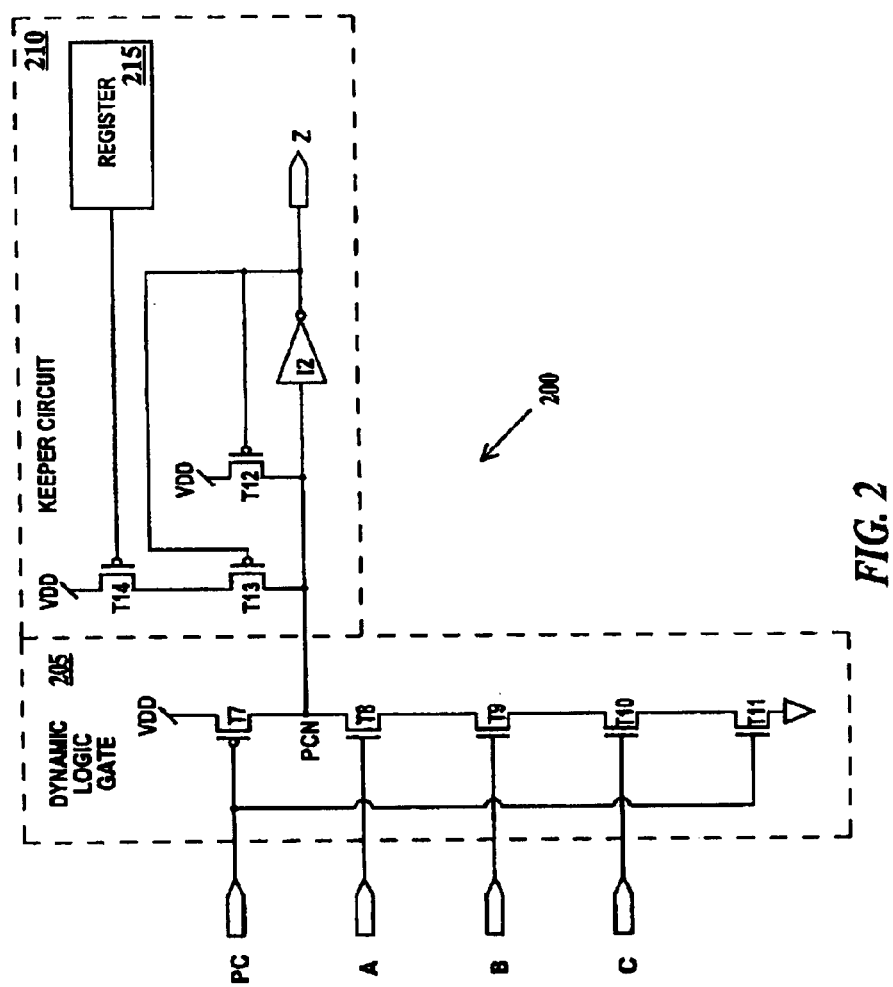
FIG. 2 is a schematic diagram of a dynamic circuit according to a first embodiment of the present invention.

FIG. 2 is a schematic diagram of a dynamic circuit according to a first embodiment of the present invention. In FIG. 2, dynamic circuit 200 includes a dynamic logic gate 205 having inputs PC, A, B, and C and a precharge/output node PCN and a keeper circuit 210 having an output Z. An input of keeper circuit 210 is coupled to precharge/output node PCN of dynamic logic gate 205.

Dynamic logic gate 205 is a three input domino NAND gate and is used as an exemplary dynamic logic gate. Other types of domino gates or other combinational logic gates may be substituted. Dynamic logic gate 205 includes PFET T7, and NFETs T8, T9, T10 and T11. Dynamic logic gate 205 is a duplicate of dynamic logic gate 105 illustrated in FIG. 1 and described supra, wherein PFET T7, and NFETs T8, T9, T10 and T11 of dynamic logic gate 205 correspond respectively to PFET T1, and NFETs T2, T3, T4 and T5 of dynamic logic gate 105.

Keeper circuit 210 includes a first keeper device (PFET T12) an inverter 12. The drain of PFET T12 and the input of inverter 12 are coupled to precharge/output node PCN. The output of inverter 12 is coupled to output Z. The gate of PFET T12 is coupled between the output of inverter 12 and output Z. The source of PFET T12 is coupled to VDD. Keeper circuit 210 further includes an immunity gating device (PFET T14), a second keeper device (PFET T13) and a register 215. The drain of PFET T13 is coupled to precharge/output node PCN, the source of PFET T13 is coupled to the drain of PFET T14, and the gate of PFET T13 is coupled to the gate of PFET T12. The source of PFET T14 is coupled to VDD and the gate of PFET T14 is coupled to register 215. PFET T13 and PFET T12 are capable of supplying only a trickle of positive charge. The amount of charge PFETs T12 and T13 can supply may be the same or PFET T13 may supply more or less charge than PFET T12.

Register 215 contains a bit register storing an enable-enhanced immunity bit (EI) and necessary circuitry to drive an EI signal to the gate of PFET T14. When the EI signal is a logical 0, enhanced immunity is enabled and when the EI bit is a logical 1, enhanced immunity is disabled.

A logical 0 (the precharge state) on precharge/output node PCN turns on PFETs T12 and T13 so precharge/output node PCN is coupled to VDD. Since PFET T12 is coupled directly to VDD, PFET T12 supplies charge to precharge/output node PCN whenever dynamic circuit 200 is in precharge mode. However, PFET T13 is gated by PFET T14, and can only supply charge to precharge/output node PCN when the EI signal is a logical 0 (enhanced immunity enabled). During evaluate mode both PFETs T12 and T13 are off. In enhanced immunity mode, Qcrit is increased, so the clock frequency of dynamic circuit 200 may need to be decreased.

While only two keeper devices are illustrated in FIG. 2, a third keeper device responding to a second EI bit may be added, and there is no limit to the number of additional keeper devices responding to corresponding EI bits that may be added.

Figure 3:
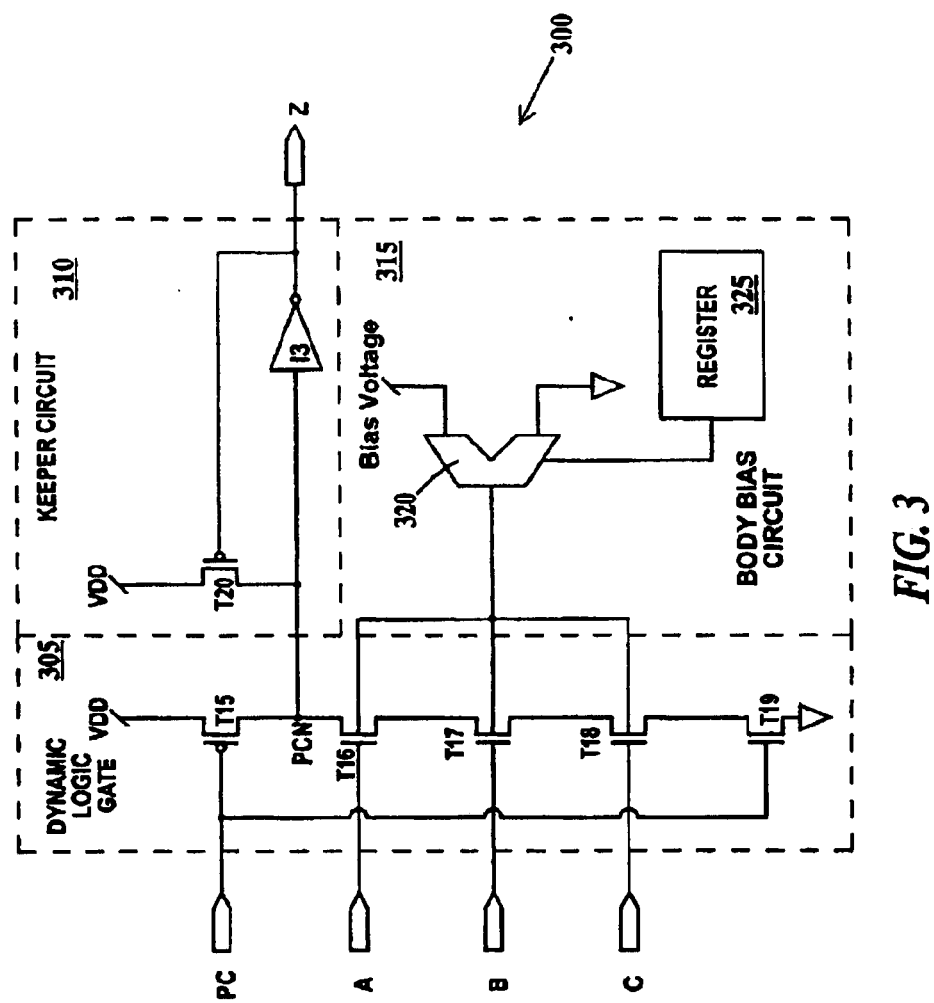
FIG. 3 is a schematic diagram of a dynamic circuit according to a second embodiment of the present invention.

FIG. 3 is a schematic diagram of a dynamic circuit according to a second embodiment of the present invention. In FIG. 3, dynamic circuit 300 includes a dynamic logic gate 305 having inputs PC, A, B, and C and a precharge/output node PCN and a keeper circuit 310 having an output Z. An input of keeper circuit 310 is coupled to precharge/output node PCN of dynamic logic gate 305. Dynamic circuit 300 further includes a body bias circuit 315 coupled to dynamic logic circuit 305 as described infra.

Dynamic logic gate 305 is a three input domino NAND gate and is used as an exemplary dynamic logic gate. Other types of domino gates or other combinational logic gates may be substituted. Dynamic logic gate 305 includes PFET T15, and NFETs T16, T17, T18 and T19. Dynamic logic gate 305 is a similar to gate 105 illustrated in FIG. 1 and described supra, wherein PFET T15, and NFETs T16, T179, T18 and T19 of dynamic logic gate 305 correspond respectively to PFET T1, and NFETs T2, T3, T4 and T5 of dynamic logic gate 105. The differences being coupling of the bodies of NFETs T16, T17 and T18 as described infra.

Keeper circuit 310 includes a keeper device (PFET T20) an inverter 13. The drain of PFET T20 and the input of inverter 13 are coupled to precharge/output node PCN. The output of inverter 13 is coupled to output Z. The gate of PFET T20 is coupled between the output of inverter 13 and output Z. The source of PFET T20 is coupled to VDD. Keeper circuit 310 functions identically to keeper circuit 110 illustrated in FIG. 1 and describes supra.

Body bias circuit 315 includes a multiplexer 320 and a register 325. A first input of multiplexer 320 is coupled to a positive bias voltage and a second input of multiplexer 320 is coupled to ground. The output of multiplexer 320 is coupled to each body of NFETs T16, T17 and T18 of dynamic logic gate 305. Register 325 is coupled to the control input of multiplexer 320.

Register 325 contains a bit register storing an enable enhanced immunity (EI) bit and necessary circuitry to drive an EI signal to the control input of multiplexer 320. When the EI signal is a logical 0, enhanced immunity is enabled and ground is applied to the bodies of NFETs T16, T17 and T18. When the EI bit is a logical 1, enhanced immunity is disabled and bias voltage is supplied to the bodies of NFETs T16, T17 and T18.

Independent body bias is easily applied to devices fabricated in SOI substrates. In bulk silicon applying substrate bias is equivalent. In the case of a bulk silicon substrate, NFETs T16, T17 and T18 are fabricated in a P-well isolated from other devices. Body bias circuit 320 would then be coupled to the P-well. In operation, body bias is applied static, that is when dynamic circuit 300 is operated. Applying a positive bias voltage (enhanced immunity not enabled) to the bodies of NFETs T16, T17 and T18 decreases the threshold voltage ($V_T$) of those devices. Applying ground (enhanced immunity enabled) to the bodies of NFETs T16, T17 and T18 increases the threshold voltage ($V_T$) of those devices. Increasing the threshold of NFETs T16, T17 and T18 makes NFETs T16, T17 and T18 harder to turn on and thus increases immunity to radiation events.

While the same bias was described as being applied to bodies of all domino input NFETs, it is possible to apply a first bias to a first set of input NFETs, a second bias to a second set of input NFETs and so on by adding additional multiplexer's responding to corresponding additional EI bits.

Figure 4:
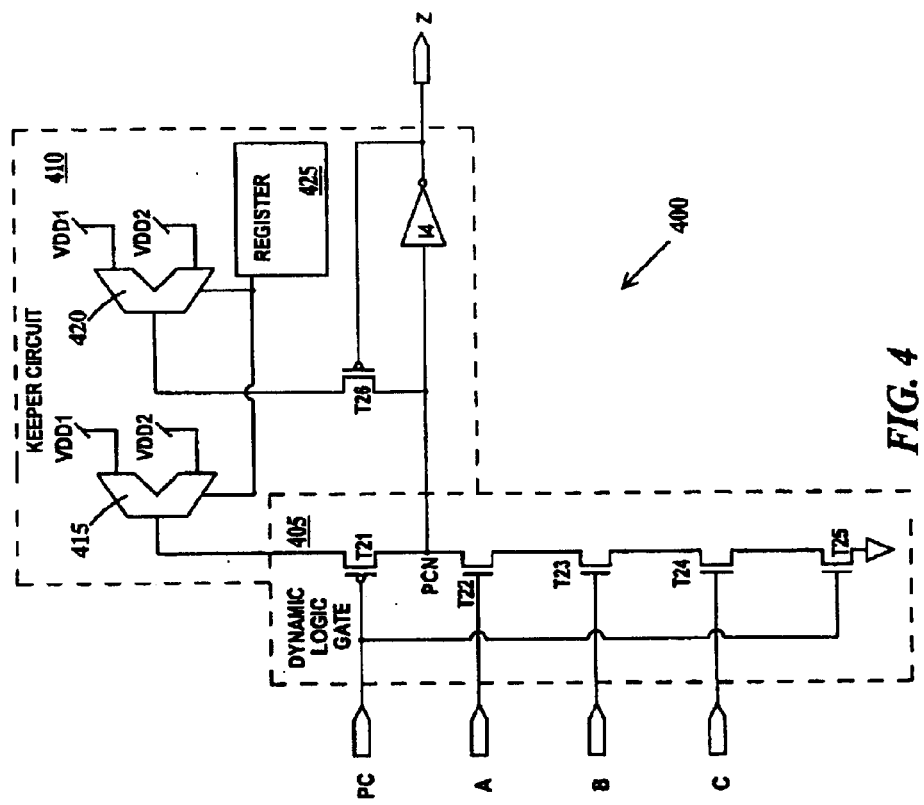
FIG. 4 is a schematic diagram of a dynamic circuit according to a third embodiment of the present invention.

FIG. 4 is a schematic diagram of a dynamic circuit according to a third embodiment of the present invention. In FIG. 4, dynamic circuit 400 includes a dynamic logic gate 405 having inputs PC, A, B, and C and a precharge/output node PCN and a keeper circuit 210 having an output Z. An input of keeper circuit 410 is coupled to precharge/output node PCN of dynamic logic gate 405.

Dynamic logic gate 405 is a three input domino NAND gate and is used as an exemplary dynamic logic gate. Other types of domino gates or other combinational logic gates may he substituted. Dynamic logic gate 405 includes PFET T21, and NFETs T22, T23, T24 and T25. Dynamic logic gate 405 is similar to dynamic logic gate 105 illustrated in FIG. 1 and described supra, wherein PFET T21, and NFETs T22, T23, T24 and T25 of dynamic logic gate 205 correspond respectively to PFET T1, and NFETs T2, T3, T4 and T5 of dynamic logic gate 105. The difference is the gate of PFET T21 is coupled to a VDD source in keeper circuit 410 as described infra.

Keeper circuit 410 includes a keeper device (PFET T26) an inverter 14, a first multiplexer 415, a second multiplexer 420, and a register 425. The drain of PFET T26 and the input of inverter 14 are coupled to precharge/output node PCN. The output of inverter 14 is coupled to output Z. The gate of PFET T26 is coupled between the output of inverter 14 and output Z. The source of PFET T26 is coupled to an output of second multiplexer 420. PFET T26 functions similarly to PFET T6 of dynamic circuit 100 illustrated in FIG. 1 and described supra, except that PFET T26 charges precharge/output node PCN with a selectable voltage as described infra. A first input of first multiplexer 415 is coupled to VDD1 and a second input of first multiplexer 415 is coupled to VDD2. A first input of second multiplexer 420 is coupled to VDD1 and a second input of second multiplexer 420 is coupled to VDD2. VDD1 is greater than VDD2.

Register 425 contains a bit register storing an enable-enhanced immunity (EI) bit and necessary circuitry to drive an EI signal to control inputs of first and second multiplexer's 415 and 420. When the EI signal is a logical 0, enhanced immunity is enabled and PFET T26 is coupled to VDD1. When the EI bit is a logical 1, enhanced immunity is disabled and PFET T26 is coupled to VDD2.

Similarly, PFET T21 (the precharge device of dynamic logic gate 405) is coupled to an output of first multiplexer 415. When the EI signal is a logical 0, enhanced immunity is enabled and PFET T21 is coupled to VDD1 thus precharging precharge/output node PCN to VDD1. When the EI bit is a logical 1, enhanced immunity is disabled and PFET T26 is coupled to VDD2 thus precharging precharge/output node PCN to VDD2.

The higher the supply voltage to dynamic logic gate 405, the more resistant dynamic logic gate 405 is to radiation events. The supply voltage to dynamic logic gate 405 via PFET T21 and the keeper voltage applied to precharge/output node PCN may thus be increased dynamically when increased soft error rate immunity is desired or statically for applications requiring increased soft error rate immunity.

There are two modes of operation for dynamic gate circuits 200, 300 and 400. The EI bit may be fixed when the integrated circuit chip is fabricated or may be changed dynamically as the Qcrit required of dynamic gate circuits 200, 300 and 400 change over time.

While two multiplexer's are illustrated in FIG. 4, a single multiplexer coupled to both PFETs T21 and T26 may be used. And while only voltage sources, VDD1 and VDD2, are illustrated in FIG. 4, three or more supply voltages, each corresponding to an additional EI bit may be added.

All three embodiments of the present invention may be applied to both silicon and SOI devices.

Thus, the present invention provides a method to set the Qcrit level of a dynamic circuit as a function of the soft error immunity level of the application for which the dynamic circuit is being used.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the multiplexer's of various embodiments of the present invention may be replaced by other switching circuits, and the registers of the various embodiments may be replaced with circuits other than registers capable supplying enabling signals. Therefore, it is intended that the following claims cover all such modifications and changes as fall within the true spirit and scope of the invention.

What is claimed is:

1. An integrated circuit comprising:

a dynamic logic gate having an output node at which a logical output value of the logic gate is detected; and a keeper circuit capable of alternating the soft error susceptibility of said dynamic logic gate, the keeper circuit providing a selectable critical charge to the output node, the keeper circuit coupled to the output node and coupled to a feedback device, the keeper circuit and a precharge device of the dynamic logic gate coupled to an output of a multiplexer, the multiplexer adapted to selectively couple the keeper circuit and the precharge device to one of two or more voltage supplies in response to an immunity enable signal received on a control input of the multiplexer.

2. An integrated circuit comprising:

a dynamic logic gate having an output node at which a logical output value of the logic gate is detected;

a keeper circuit capable of altering the soft error susceptibility of said dynamic logic gate, the keeper circuit providing a selectable critical charge to the output node, the keeper circuit coupled to the output node of a first multiplexer adapted to selectively coupled the keeper circuit to one of two or more voltage supplies in response to an immunity enable signal recieved on a control input of the first multiplexer; and a second multiplexer adapted to selectively couple a precharge device of the dynamic logic gate to the same voltage supply that the keeper circuit is coupled to, in response to an immunity enable signal received on a control input of the second multiplexer.

3. An integrated circuit comprising:

a dynamic logic gate having an output node at which a logical output value of the logic gate is detected;

a selectable circuit capable of alternating the soft error susceptibility of said dynamic logic gate;

a keeper circuit providing a critical charge to the output node, the keeper circuit coupled to the output node and coupled to a feedback device; and a body bias circuit, the body bias circuit adapted to selectively alter the susceptibility of input devices of the dynamic logic gate to radiation events, the body bias circuit including a multiplexer adapted to selectively couple the bodies of the input devices to one of two or more biasing voltages in response to an immunity enable signal received on a control input of the multiplexer.

4. An integrated circuit comprising:

a dynamic logic gate having an output node at which a logical output value of the logic gate is detected; and a keeper circuit adapted to selectively alter the critical charge of the dynamic logic gate, the keeper circuit providing a selectable critical charge to the output node, the keeper device coupled to the output node and coupled to a feedback device, the keeper circuit and a precharge device of the dynamic logic gate coupled to an output of a multiplexer, the multiplexer adapted to selectively coupled the keeper device and the precharge device to one of two or more voltage supplies in response to an immunity enable signal received on a control input of the multiplexer.

5. An integrated circuit comprising:

a dynamic logic gate having an output node at which a logical output value of the logic gate is detected;

a keeper circuit adapted to selectively alter the critical charge to the dynamic logic gate, the keeper circuit including:

a keeper device providing a selectable critical charge to the output node, the keeper device coupled to the output node and coupled to a feedback device, the keeper device coupled to an output of a first multiplexer adapted to selectively coupled the keeper device to one of two or more voltage supplies in response to an immunity enable signal recieved on a control input of the first multiplexer; and a second multiplexer adapted to selectively couple a precharge device of the dynamic logic gate to the same voltage supply that the keeper device is coupled to in response to an immunity enable signal received on a control input of the second multiplexer.

6. An integrated circuit comprising:

a dynamic logic gate having an output node at which a logical output value of the logic gate is detected;

a keeper circuit providing a level of critical charge to the output node, a keeper device coupled to the output node coupled to a feedback device; and a body bias circuit, the body bias circuit adapted to selectively alter the bias device applied to the bodies of input devices of the dynamic logic gate, the body bias circuit including a multiplexer adapted to selectively coupled the bodies of the input devices of the dynamic logic gate to one of two or more biasing voltages is response to an immunity enable signal received on a control input of the multiplexer.

7. The integrated circuit of claim 3, wherein said immunity enable signal is generated dynamically or is fixed during manufacture of said integrated circuit.

8. The integrated circuit of claim 4, where said immunity enable signal is generated dynamically or is fixed during manufacture of integrated circuit.

* * * * *